United States Patent
Choi

[19]

[11] Patent Number: 5,891,781
[45] Date of Patent: Apr. 6, 1999

[54] METHOD FOR CODING MASK READ-ONLY MEMORY

[75] Inventor: Sung Gon Choi, Chungcheongbuk-do, Rep. of Korea

[73] Assignee: LG Semicon Co., Ltd., Cheongju-Si, Rep. of Korea

[21] Appl. No.: 924,318

[22] Filed: Sep. 5, 1997

[30] Foreign Application Priority Data

Dec. 26, 1996 [KR] Rep. of Korea ................... 1996-72194

[51] Int. Cl.$^6$ .................................................. H01L 21/22
[52] U.S. Cl. .......................................... 438/278; 257/390
[58] Field of Search .................................... 257/349, 390, 257/391, 392, 393, 402, 321, 316; 438/275, 278, 279

[56] References Cited

U.S. PATENT DOCUMENTS

| | | | |
|---|---|---|---|
| 5,156,989 | 10/1992 | Williams et al. | 438/275 |
| 5,196,910 | 3/1993 | Moriuchi et al. | 257/390 |
| 5,242,841 | 9/1993 | Smayling et al. | 438/275 |
| 5,504,708 | 4/1996 | Santin et al. | 390/390 |
| 5,514,896 | 5/1996 | Tsunoda | 257/390 |
| 5,583,361 | 12/1996 | Morishita | 257/345 |
| 5,675,172 | 10/1997 | Miyamoto et al. | 257/392 |

*Primary Examiner*—Olik Chaudhuri
*Assistant Examiner*—William David Coleman

[57] ABSTRACT

A method for coding a mask read-only memory (ROM) implants impurity ions into a semiconductor substrate so as to form a first impurity region, and forms a plurality of gate electrodes on the semiconductor substrate. Next, sidewalls on both sides of each of the gate electrodes are formed, and source and drain impurity regions are formed in the semiconductor substrate at respective sides of each of the gate electrodes. Then a mask over the semiconductor substrate, which exposes at least one of the gate electrodes and which exposes the source and drain impurity regions associated with the exposed gate electrode, is formed, and code ions are implanted into the semiconductor substrate. The semiconductor substrate is also annealed so that the source and drain impurity regions associated with the exposed gate electrode electrically contact the first impurity region.

12 Claims, 3 Drawing Sheets

1

METHOD FOR CODING MASK READ-ONLY MEMORY

BACKGROUND OF THE INVENTION

1. Field of the Invention

The present invention relates to a semiconductor memory device and, more particularly, to a coded mask read only memory (ROM) and a method for coding a mask ROM.

2. Discussion of the Related Art

A conventional method for coding a mask read-only memory (ROM) will be explained with reference to the accompanying drawings.

FIGS. 1a through 1d are cross-sectional views showing process steps of a method for coding a mask ROM. Referring to FIG. 1a, field regions and active regions are defined on a first conductive type semiconductor substrate 1. Next, field ion implantation into the field regions of the substrate 1 is performed to form a plurality of field oxide layers 2 which are separated from one another by a predetermined distance. Then, from one another by a predetermined distance. Then, implantation of depletion ions into the entire surface of the semiconductor substrate 1 inclusive of the field oxide layers 2 is performed. In this case, since a channel should be of an N-type in an NMOS depletion mode, arsenic ions, which are impurity ions of the N-type, are used as the depletion ions.

Referring to FIG. 1b, a polycrystalline silicon layer is formed on the entire surface of the semiconductor substrate 1 inclusive of the field oxide layer 2, and subjected to a photolithography process to pattern the polycrystalline silicon into gate electrodes 3 on the active regions of the semiconductor substrate 1. Subsequently, an oxide layer is formed over the entire surface of the semiconductor substrate 1 inclusive of the gate electrodes 3, and subjected to etch-back to form gate sidewalls 4 on both sides of each of the gate electrodes 3.

Referring to FIG. 1c, with the gate electrodes 3 and the sidewalls 4 serving as masks, a source and drain ion implantation process is performed to respectively form source and drain impurity regions 5 and 6 in the semiconductor substrate 1 at the sides of each of the gate electrodes 3. Subsequently, in order to form an off-transistor, according to a customer's demands, using code ion implantation, all regions except a selected one of the gate electrodes 3 are masked. That is, a photoresist layer 7 is coated over the entire surface of the semiconductor substrate 1 inclusive of the selected gate electrode 3. Then the photoresist layer 7 is patterned to expose only the selected gate electrode 3. Next, with the photoresist pattern 7 serving as a mask, code ions are implanted through the selected gate electrode 3 to form the off-transistor.

Referring to FIG. 1d, the remaining photoresist 7 is removed to complete the formation of the on-transistors and the off-transistor. As a result, data-coding is completed.

FIG. 2a is a graph showing operation characteristics of a conventional depletion type transistor, and FIG. 2b is a graph showing operation characteristics of a conventional enhancement type transistor.

As shown by FIGS. 2a and 2b, a channel is formed in a depletion type transistor even though a positive voltage is not applied to a gate electrode, and a channel is formed in an enhancement type transistor as long as a voltage higher than a threshold voltage is applied to the gate electrode.

The conventional method for coding a mask ROM has disadvantages. Since code ion implantation is carried out in the channel region, the substrate in the channel region is damaged. Moreover, the substrate damage increases the resistance to current flowing along the channel region; thus disturbing the current flow.

SUMMARY OF THE INVENTION

Therefore, the present invention is directed to a coded mask ROM and a method for coding a mask ROM that substantially obviates one or more of the problems due to limitations and disadvantages of the related art.

An object of the invention is to provide a method for coding a mask ROM which prevents substrate damage in a channel region due to code ion implantation.

A further object of the present invention is to provide a coded mask ROM having an increased cell current and improved speed characteristics.

These and other objects are achieved by providing a method for coding a mask ROM, the method comprising the steps of: (a) implanting impurity ions into a semiconductor substrate so as to form a first impurity region; (b) forming a plurality of gate electrodes on the semiconductor substrate; (c) forming sidewalls on both sides of each of the gate electrodes; (d) forming source and drain impurity regions in the semiconductor substrate at respective sides of each of the gate electrodes; (e) forming a mask over the semiconductor substrate which exposes at least one of the gate electrodes and exposes the source and drain impurity regions associated with the exposed gate electrode; (f) implanting code ions into the semiconductor substrate; (g) annealing the semiconductor substrate so that the source and drain impurity regions associated with the exposed gate electrode electrically contact the first impurity region.

These and other objects are also achieved by providing a coded mask ROM, comprising: a substrate having a buried first impurity region; a first gate electrode formed on said substrate; a first source impurity region formed in said substrate on a first side of said first gate electrode and in electrical contact with said first impurity region; a first drain impurity region formed in said substrate on a second side of said first gate electrode and in contact with said first impurity region.

Additional features and advantages of the invention will be set forth in the description which follows and in part will be apparent from the description above, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

FIGS. 3a to 3d are cross-sectional views showing process steps of a method for coding a mask ROM according to the present invention.

Figure 1A:
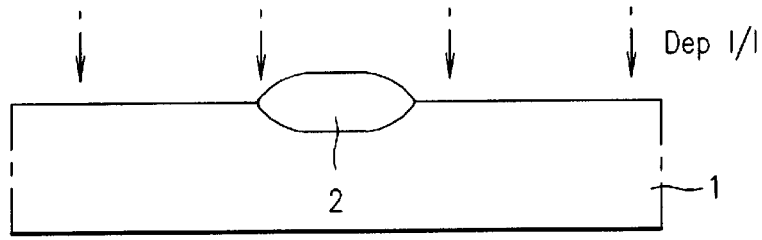
FIGS. 1a to 1d are cross-sectional views showing process steps of a method for coding a conventional mask ROM.
Figure 1B:
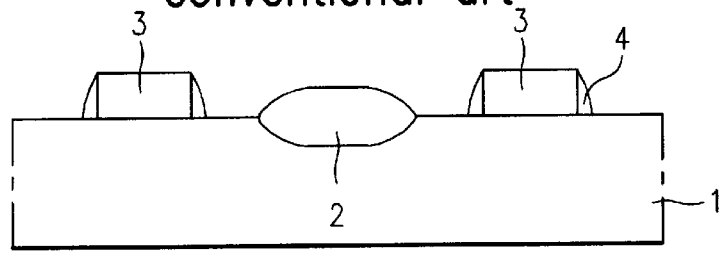
Figure 1C:
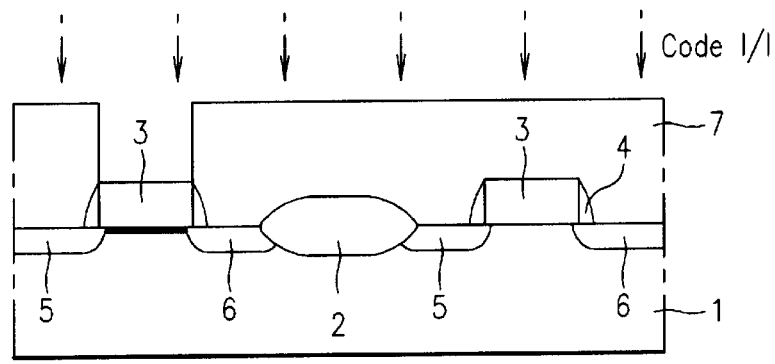
Figure 1D:
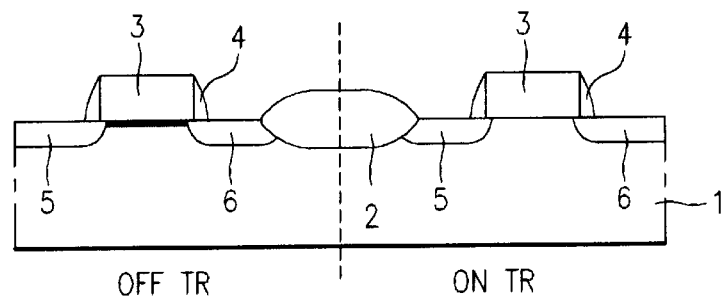
Figure 2A:
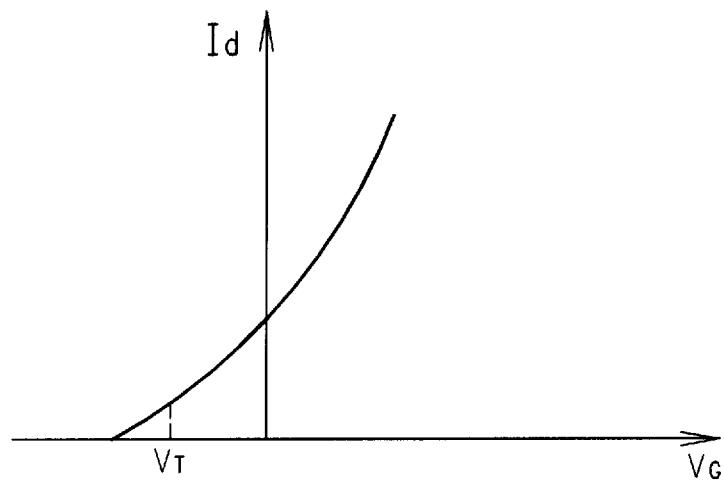
FIG. 2a is a graph showing operation characteristics of a conventional depletion type transistor.
Figure 2B:
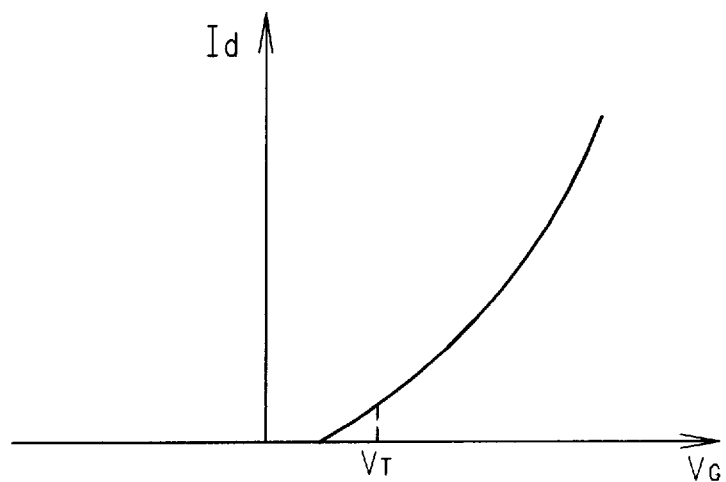
FIG. 2b is a graph showing operation characteristics of a conventional enhancement type transistor.
Figure 3A:
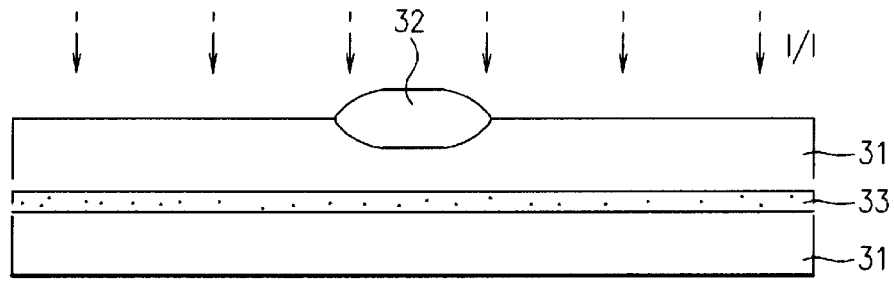
FIGS. 3a to 3d are cross-sectional views showing process steps of a method for coding a mask ROM in accordance with a preferred embodiment of the present invention.

Referring initially to FIG. 3a, field regions and active regions are defined in a semiconductor substrate 31. Next, a plurality of field oxide layers 32 are formed in the field regions of the semiconductor substrate 31. Then, ions are implanted into the entire surface of the semiconductor substrate 31 inclusive of the field oxide layers 31 to form a first impurity region 33. The impurity ions are heavily doped, and are implanted deeper than the yet to be formed channel regions by means of a high implanting energy. The semiconductor substrate 31 is of a P-conductive type, and the impurity ions of the first impurity region 33 are of an N-conductive type such as arsenic.

Figure 3B:
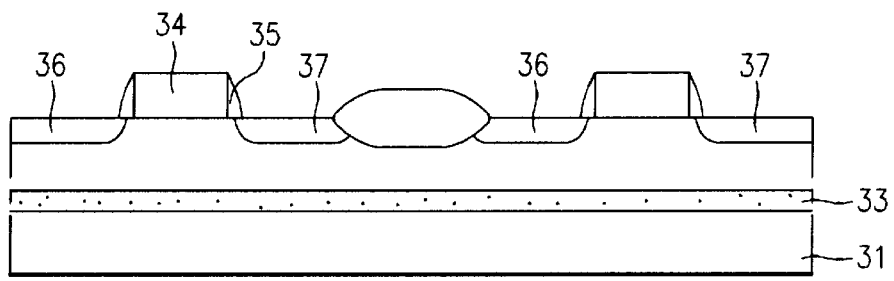

Referring to FIG. 3b, a polycrystalline silicon layer is formed over the entire surface of the semiconductor substrate 31 inclusive of the field oxide layers 32, and is selectively removed to form a plurality of gate electrodes 34 on the active regions of the substrate 31. Subsequently, an insulating layer is formed over the entire surface of the semiconductor substrate 31 inclusive of the gate electrodes 34, and is subjected to etch-back so that sidewalls 35 are formed on both sides of the gate electrodes 34. Thereafter, with the gate electrodes 34 and the sidewalls 35 serving as masks, impurity ions are implanted and diffused so that source and drain impurity regions 36 and 37 are respectively formed in the semiconductor substrate 31 at the sides of the gate electrodes 34. The source and drain impurity regions 36 and 37 are shallower than the first impurity region 33.

Figure 3C:
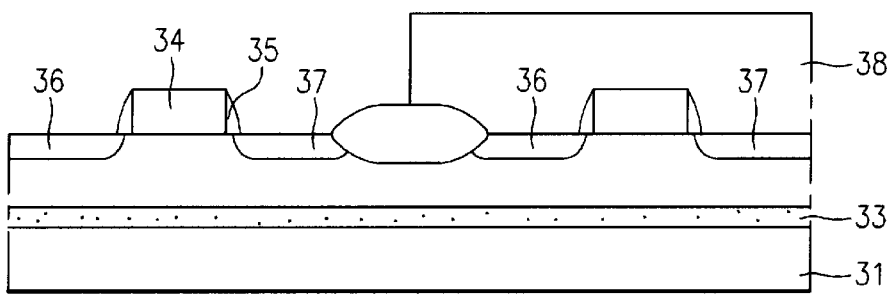

Referring then to FIG. 3c, a photoresist layer 38 is coated over the entire surface of the semiconductor substrate 31 inclusive of the gate electrodes 34, and subjected to exposure and development so that only the portion of the substrate 31 where the off-transistor is to be formed is exposed.

Figure 3D:
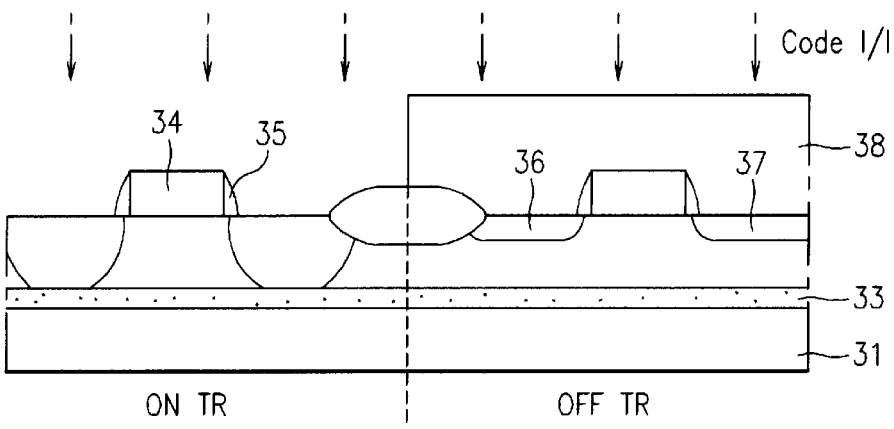

Referring to FIG. 3d, with the remaining photoresist layer 38 serving as a mask, a code ion implantation process is carried out. The code ions are implanted deeper into the substrate 31 than the source and drain impurity regions 36 and 37. Subsequently, the source and drain regions 36 and 37 are activated by annealing which causes the source and drain impurity regions 36 and 37 of the off-transistor to contact the first impurity region 33. Accordingly, the source and drain regions 36 and 37 are electrically linked with the first impurity region 33, and a channel is formed by the first impurity region 33.

The method for coding a mask ROM according to the present invention has several advantages. First, the channel resistance of an off-transistor is minimized by the electrical connection of the first impurity region 33 with the source and drain impurity regions 36 and 37 so that the cell current is increased and the speed characteristics of a device are improved.

Second, unlike the conventional art, the photoresist 38 does not have to mask all but the gate electrode of the off-transistor being formed. Instead, the gate electrode 34 of the off-transistor being formed is used for self-aligned ion implantation which makes the code ion implantation process easier.

It will be apparent to those skilled in the art that various modification and variations can be made in the coding method of a mask ROM of the present invention without departing from the spirit or scope of the inventions. Thus, it is intended that the present invention cover the modifications and variations of this invention.

What is claimed is:

1. A method for coding a mask read-only memory (ROM), the method comprising the steps of:

(a) implanting first ions below a surface of a semiconductor substrate so as to form a first region;

(b) forming a plurality of gate electrodes on the semiconductor substrate;

(c) forming sidewalls on both sides of each of the gate electrodes;

(d) forming source and drain regions in the semiconductor substrate at respective sides of each of the gate electrodes;

(e) forming a mask over the semiconductor substrate which exposes at least one of the gate electrodes and exposes the source and drain impurity regions associated with the exposed gate electrode;

(f) implanting second ions deeper into the semiconductor substrate than the source and drain impurity regions; and (g) annealing the semiconductor substrate so that the source and drain impurity regions associated with the exposed gate electrode electrically contact the first region.

2. The method as claimed in claim 1, wherein the semiconductor substrate is of a P-conductive type and the first region is of an N-conductive type.

3. The method as claimed in claim 1, wherein the first region is deeper into the semiconductor substrate than a channel region formed between the source and drain impurity regions of each of the gate electrodes.

4. The method as claimed in claim 1, wherein the step (f) implants the code ions deeper into the semiconductor substrate than the source and drain regions.

5. The method as claimed in claim 1, wherein the step (d) forms source and drain impurity regions in the substrate to a first depth which is less than a second depth at which the first region is formed.

6. The method as claimed in claim 1, prior to the step (a), further comprising:

(h) forming isolation layers in the semiconductor substrate to electrically isolate each device associated with one of the gate electrodes.

7. The method as claimed in claim 1, further comprising the steps of:

(h) defining field regions and active regions on the semiconductor substrate; and (i) forming a device isolation layer in each of the field regions.

8. The method as claimed in claim 1, wherein said first ions are first impurity ions, and said second ions are code ions.

9. A method for coding a mask read-only memory (ROM), the method comprising the steps of:

(a) forming a first region below a surface of a semiconductor substrate;

(b) forming a plurality of gate electrodes on the semiconductor substrate;

(c) forming source and drain impurity regions in the semiconductor substrate at respective sides of each of the gate electrodes; and (d) increasing a size of at least one selected pair of source and drain impurity regions such that the selected source and drain regions electrically contact the first region.

10. The method as claimed in claim 9, wherein the step (d) comprises:
   (d1) forming a mask over the semiconductor substrate which exposes the gate electrodes associated with the selected source and drain impurity regions and exposes the selected source and drain impurity regions;
   (d2) implanting code ions deeper into the semiconductor substrate than the selected source and drain impurity regions; and
   (d3) annealing the semiconductor substrate so that the selected source and drain impurity regions contact the first region.

11. The method as claim in claim 9, wherein the first region is deeper into the semiconductor substrate than a channel region formed between the source and drain impurity regions of each of the gate electrodes.

12. The method as claimed in claim 9, wherein the step (c) forms source and drain impurity regions in the semiconductor substrate to a first depth which is less than a second depth at which the first region is formed.

* * * * *